United States Patent [19]

Kamei et al.

[11] Patent Number: 4,911,815
[45] Date of Patent: Mar. 27, 1990

[54] SPUTTERING APPARATUS FOR PRODUCTION OF THIN FILMS OF MAGNETIC MATERIALS

[75] Inventors: Mitsuhiro Kamei; Eiji Setoyama; Shinzou Oikawa, all of Hitachi, Japan

[73] Assignee: Hitachi, Ltd., Tokyo, Japan

[21] Appl. No.: 281,777

[22] Filed: Dec. 9, 1988

[30] Foreign Application Priority Data

Dec. 17, 1987 [JP] Japan ................... 62-317518

[51] Int. Cl.⁴ ................... C23C 14/50; C23C 14/56
[52] U.S. Cl. ................... 204/298; 204/192.12; 204/192.2
[58] Field of Search ......... 204/192.2, 298 MC, 192.12

[56] References Cited

U.S. PATENT DOCUMENTS 4,673,482 6/1987 Setoyama et al. ................. 204/298

FOREIGN PATENT DOCUMENTS 57-78123 5/1982 Japan ................... 204/298

Primary Examiner—Aaron Weisstuch
Attorney, Agent, or Firm—Antonelli, Terry & Wands

[57] ABSTRACT

A magnetic film deposition chamber having Helmholtz coils and a preliminary chamber are connected through a gate valve. Two magnetic plates are fixed to the magnetic film deposition chamber near the both ends thereof. Substrates overlying apertures of a substrate holder are moved by a conveyer together with the substrate holder. The conveyor moves from the preliminary chamber to the film deposition chamber through the gate valve. The substrates then positioned over and between the magnetic plates and are located above the target in the magnetic film deposition chamber.

3 Claims, 3 Drawing Sheets

SPUTTERING APPARATUS FOR PRODUCTION OF THIN FILMS OF MAGNETIC MATERIALS

FIELD OF THE INVENTION

The present invention relates to a sputtering apparatus for production of thin films of magnetic materials.

BACKGROUND OF THE INVENTION

Apparatus for depositing a magnetic thin film on a substrate by depositing material sputtered from a target consisting of a film forming bulk material is known. Sputtering of the material should be carried out while applying a parallel magnetic field so that the magnetic domains in the films being formed can be oriented in the same direction.

In this case, there are two kinds of methods using permanent magnets or magnetic field coils as means for generating the parallel magnetic field. The method of the magnetic field coils is better compared with the method of the permanent magnets because the magnetic field characteristic thereof does not cause deteriorate with time and it is adjustable.

However, the method of the magnetic field coils has a drawback in that it is difficult to apply a magnetic field which is uniform and parallel to the entire substrate surface.

For resolving the drawback, a sputtering apparatus for production of thin films of magnetic materials was proposed which adjusts the magnetic field applied to the substrate using a magnetic plate as shown in, for instance, FIG. 1 of Japanese Patent Laid-Open No. 57-78123 published on May 15, 1982 and entitled "Manufacturing Method of Different Direction magnetic Thin Film".

In general, sputtering apparatus for production of thin films of magnetic materials comprises a target consisting of a film forming bulk material, a magnetic film deposition chamber which is provided with a magnetic field generating apparatus, and a preliminary chamber which is connected to the magnetic film deposition chamber through a gate valve which opens and closes.

Usually, a number of preliminary chambers are connected to the magnetic film deposition chamber through gate valves provided between the preliminary chambers and the magnetic film deposition chamber. In each preliminary chamber, all kinds of preliminary treatment such as preliminary heating, gradual cooling, abrupt cooling, intake, and offtake, are performed on magnetic field deposition by closing the gate valve.

The substrate, which receives the predetermined preliminary treatment within the preliminary chamber while being held on a substrate holder, is conveyed to the magnetic film deposition chamber through the opened gate valve by means of a conveyor of the substrate holder.

In the magnetic film deposit chamber, a magnetic field, having a predetermined direction generated by a magnetic field generating apparatus, is applied to the surface of the substrate. The bulk material is sputtered from the target to the surface of the substrate while the magnetic field is applied, so that the magnetic material is deposited on the surface of the substrate.

FIG. 1 shows a main section view of the magnetic film deposition chamber of the sputtering apparatus for production of thin films of magnetic material according to the device disclosed in FIG. 1 of the above-mentioned Japanese Patent Laid-Open No 57-78123. In the magnetic film deposition chamber, a target 10 consisting of a film forming bulk material is provided. An electrical lead 9 is fixed to the target. A pain of Helmholtz coils 3 are arranged within the magnetic film deposition chamber. The substrates 5 mounted on the substrate holder 4 are conveyed by the conveying means 8 from the preliminary chamber to the position shown between the pair of Helmholtz coils 3, and are located above the target 10. Apertures 15 are formed in the substrate holder 4. The substrates 5 are held on the substrate holder 4 conveying the apertures 15. The substrates 5 are located between a pair of magnetic plates 6 mounted on the substrate holder 4. The magnetic plates 6 mounted on the substrate holder 4 are fixed near the both ends of the substrate holder 4, respectively, along the longitudinal direction of the substrate holder 4, and are made from the same magnetic material as the target 10. The substrate holder 4 is conveyed from the preliminary chamber to the magnetic field deposition chamber through a gate valve such that the substrate holder 4 holds the substrate 5 and the magnetic plates 6.

In the apparatus disclosed in FIG. 1, at first, the gate valve between the preliminary chamber and the magnetic film deposition chamber is closed. Next, the substrates 5 are arranged between the magnetic plates 6 fixed to the substrate holder 4 at the preliminary chamber, and it is subjected to a predetermined treatment with the preliminary chamber.

After the preliminary treatment has taken place in the preliminary chamber, the substrate holder 4, which fixes the magnetic plates 6 thereon and holds the substrates 5 between the magnetic plates 6, is conveyed from the preliminary chamber to the magnetic film deposition chamber through the opened gate valve by the conveying means 8.

Next, the gate valve between the preliminary chamber and the magnetic film deposition chamber is closed, and then the surface of the substrate 5 is disposed by the bulk magnetic material 6, for instance permalloy, thus the magnetic field is applied parallel to the surface of the substrates 5 by the magnetic field generating apparatus and the bulk material is sputtered from the target 10 the surfaces of the substrates through the apertures 15 in an atmosphere of argon gas.

The magnetic material sputtered from the target 10 reaches the surfaces of the substrates 5, and forms a magnetic film which is magnetized in the same direction.

In the system explained above, since the magnetic plates 6 comprising, for instance, permalloy, dispose the substrates 5 between a pain of Helmholtz coils, the magnetic field generated by the magnetic field generating apparatus, as shown by arrow H in FIG. 1, whose main element comprises the Helmholtz coils 3, is concentrated by the magnetic plates 6 so that the magnetic field becomes parallel to the surfaces of the substrates 5 and the magnetic flux density is adjusted uniformly.

Ordinarily, a number of substrates 5 are held on the common substrate holder 4 for increasing the manufacturing performance of the magnetic films produced on the surfaces of the substrates shown in FIGS. 1 and 2, and the magnetic films are deposited on a number of the substrates at the same time.

According to the prior art, the magnetic field, which is generated by the magnetic field generating apparatus comprising the Helmholtz coils 3 as the main element, is adjusted by the magnetic plates 6 which are fixed on the substrate holder 4, and it becomes parallel to the substrate surfaces, with a uniform, high magnetic flux density, so that the apparatus of the prior art can manufacture high quality films on the substrates 5.

Since the magnetic plates 6 of the prior art are fixed on the substrate holder 4, the substrate holder 4 becomes large in size, and the large size substrate holder 4 has to be conveyed by the carrying means from the preliminary chamber to the magnetic film deposition chamber through the gate valve.

Accordingly, the preliminary chamber of the prior art requires a large space as will as the magnetic film deposition chamber for accommodating the large size substrate holder 4. The apparatus of the prior art thus has the drawback that the size thereof becomes large.

SUMMARY OF THE INVENTION

An object of the present invention is to provide a sputtering apparatus for production of thin films of magnetic materials which is small in size yet provides high quality magnetic films on the substrates.

For attaining the object, the apparatus of the present invention is characterized in that the magnetic plates are provided only in the magnetic film deposition chamber.

In the present invention, the substrate holder mounts only the substrates thereon. In the preliminary chamber, the substrate mounted on the substrate holder are given various preliminary treatments.

After the preliminary treatment is carried out, the gate valve located between the preliminary chamber and the magnetic field deposition chamber is opened. After that, the substrate holder for holding the substrates which have completed the preliminary treatment, is conveyed from the preliminary chamber to the magnetic film deposition chamber through the gate valve by means of the conveyor.

In the magnetic film deposition chamber, each means is positioned on magnetic plates fixed to the magnetic film deposition chamber near the both ends along the longitudinal direction thereof. The substrates mounted on the substrate holder, which are conveyed from the preliminary chamber to the magnetic film deposition chamber through the gate valve, are moved above the target by the carrying means.

After that, the gate valve located between the preliminary chamber and the magnetic film deposition chamber is closed. The magnetic field is applied to the surfaces of the substrates by the magnetic field generating apparatus. In the magnetic film deposition chamber, the bulk material is sputtered in an argon atmosphere from the target onto the surfaces of the substrates through the apertures of the substrate holder.

The magnetic field generated by the magnetic field generating apparatus is adjusted to be parallel to the surfaces of the substrates by the magnetic plates which are provided near the substrates. Accordingly, the magnetic field is adjusted to be uniform with high magnetic flux density.

The bulk material sputtered from the target forms high quality magnetic films which is magnetized in the same direction along the surfaces of th substrates.

DETAILED DESCRIPTION OF THE PREFERRED EMBODIMENT

Figure 1:
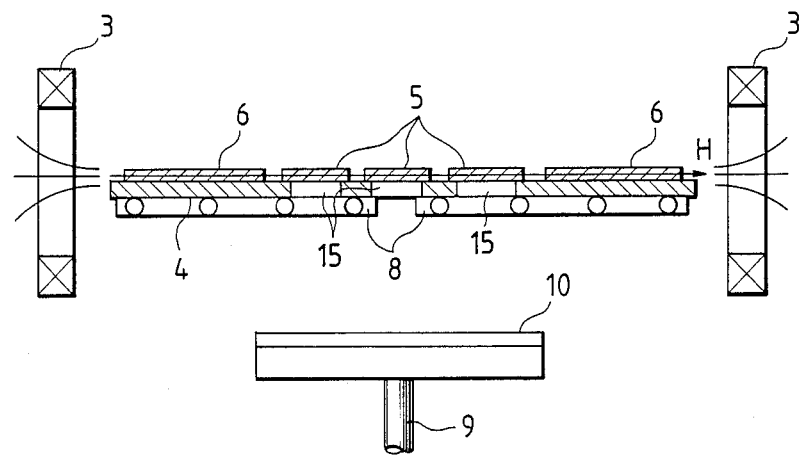
FIG. 1 is a sectional view of the prior art apparatus for depositing magnetic films.
Figure 2:
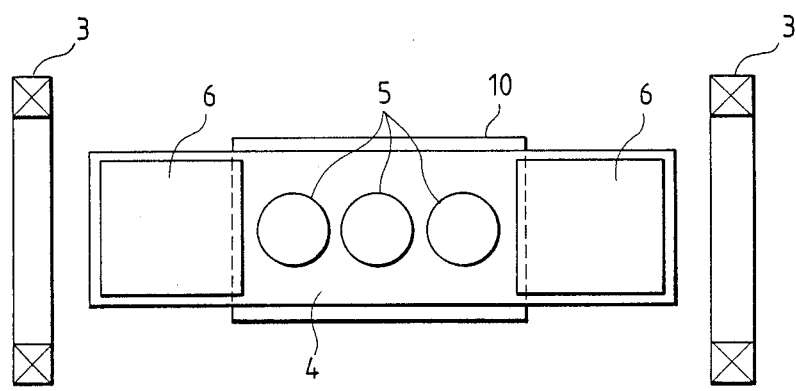
FIG. 2 is a plane view of the apparatus shown in FIG. 1.
Figure 3:
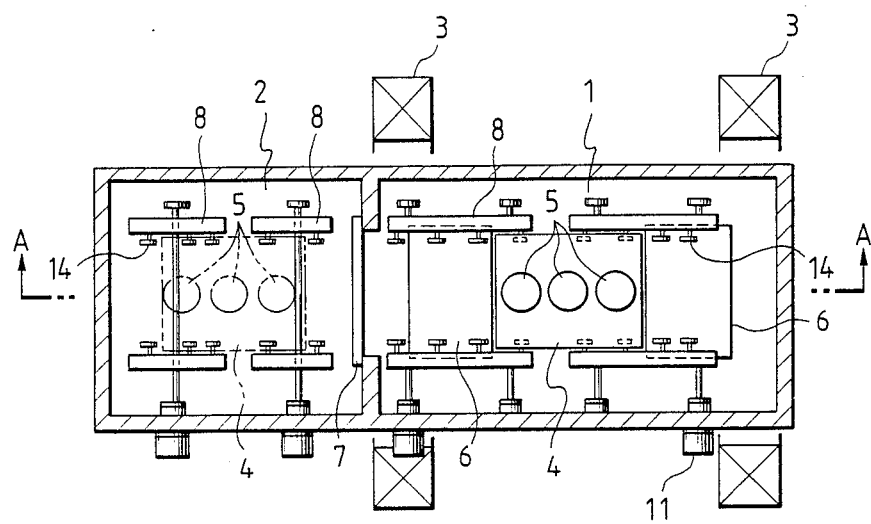
FIG. 3 is a sectional plane view of the embodiment of the present invention seen from line B—B shown in FIG. 4.
Figure 4:
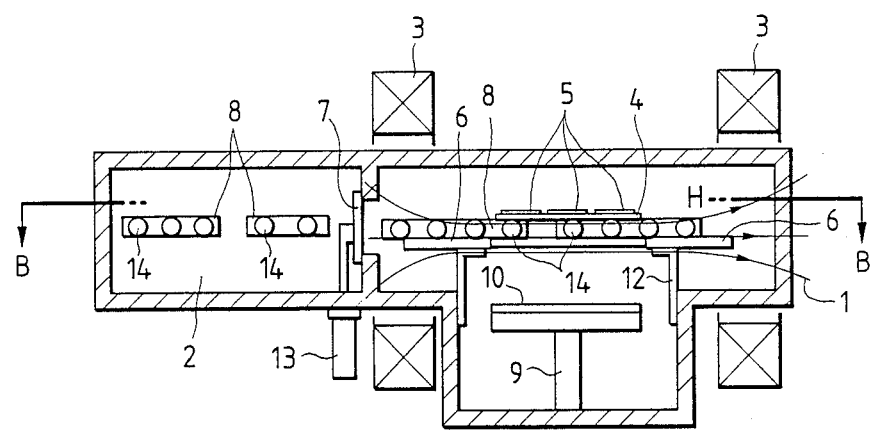
FIG. 4 is a sectional front view of the embodiment of the present invention seen from line A—A shown in FIG. 3.

Referring to FIGS. 3 and 4, the sealed magnetic film deposition chamber 1 and the sealed preliminary chamber 2 are partitioned by the gate valve 7. The gate valve 7 is opened and closed by the gate valve driving apparatus 13.

On the bottom surface of the magnetic film deposition chamber 1, the electrical lead-in 9 is provided. On the leadin 9, the target 10 comprising, or instance, permalloy is fixed.

The magnetic plates 6 comprising, for instance, permalloy having the same configuration, are fixed to supporting members 12 of the same height and predetermined distance therebetween within the magnetic film deposition chamber 1.

The Helmholtz coils 3 are arranged near the both ends of the magnetic film deposition chamber 1 around the outside of the chamber 1. The conveyor 8 driven by the conveyor motor 11 is provided within the magnetic films deposition chamber 1 and the preliminary chamber 2 for conveying the substrate holder 4 holding the substrates 5. 14 denotes the rollers of the conveyer 8.

Figure 5A:
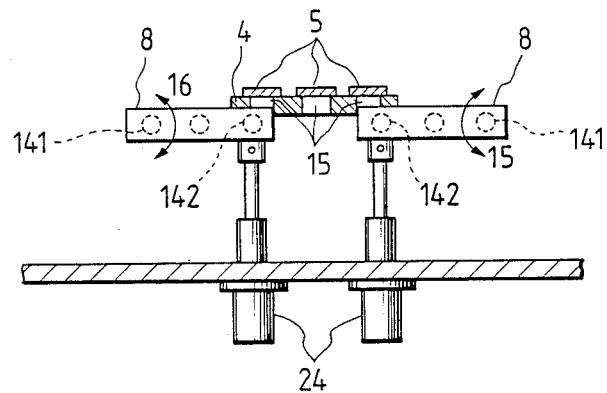
FIGS. 5A and 5B illustrate the mechanism of the present invention for finely adjusting the height of the substrate holder in the magnetic film deposition chamber.
Figure 5B:
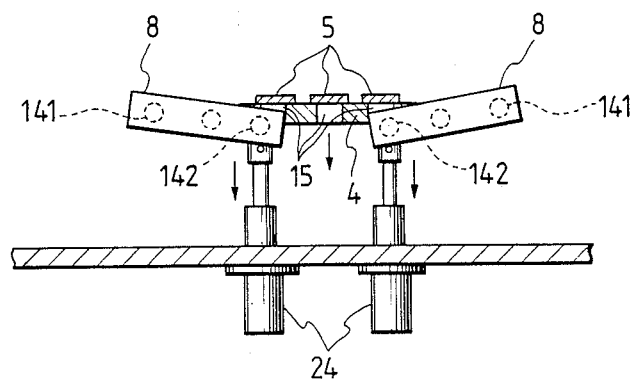

Referring to FIGS. 5A and 5B, the height of the conveyer 8 in the magnetic film deposition chamber 1 can be adjustable vertically with respect to the conveying direction of the substrate holder 4 by the adjusting means 24. However, the adjusting means 24 are not shown in FIGS. 3 and 4. FIG. 4 shows one example in which the substrate holder 4 is located at a slightly higher position on the upper surface of the sheet of the belt conveyer 8 by adjusting the height of the adjusting means 24.

In FIGS. 5A and 5B, the inner sides 142 of the conveyer 8 are adjusted by the adjusting means 24 so that the level of the conveyer 8 becomes horizontal. The outer sides 141 of the conveyer 8 are fixed relative to the magnetic film deposition chamber 1, and rotatable in the direction shown by the arrows 16. When the substrate holder 4 is moved from the preliminary chamber 2 to the magnetic film deposition chamber along the longitudinal direction of the apparatus through the gate valve 7, the conveyer 8 is adjusted to be level by the adjusting means 24 as shown in FIG. 5A. When the substrate holder 4 is introduced to the magnetic film deposit chamber 1 through the gate valve 7, the height of the substrate holder 4, or the substrate 5, is adjusted by a raising or lowering the adjusting means 2 as shown in FIG. 5B.

In the embodiment of the present invention, the Helmholtz coils 3 constitute the main portion of the magnetic field generating apparatus, and the conveyer motor 11 and the conveyer 8 constitute the carrying means.

Hereunder, we will explain the operation of the embodiment of the present invention.

When the gate valve 7 is closed by the gate valve driving apparatus 13 as shown in FIG. 4, the substrates 5 are brought into the preliminary chamber 2 by a supply means (not shown) of the substrate holder 4 and the atmosphere within the preliminary chamber 2 is evacuated by an exhaust means (not shown).

In the preliminary chamber 2, the substrates 5 shown by the dotted line, which are held by the substrate holder 4 shown by the dotted line in FIG. 3, are given a preliminary heating at a predetermined temperature for a predetermined time by a preliminary heating device (not shown).

Next, the gate valve 7 connected to the magnetic film deposition chamber 1 which is a vacuum state is opened by operation of the gate valve driving apparatus 13. By means of the conveyer motor 11, the conveyer 8 is driven so that the substrate holder 4, which holds the substrates 5, is moved from the preliminary chamber 2 to the magnetic film deposition chamber as shown by the solid line in FIG. 3.

The substrate holder 4 holding the substrates 5 is now arranged between the magnetic plates 6, and at the same time, is a slightly higher position compared with the position of the magnetic plates 6 within the magnetic film deposition chamber 1.

After the substrate holder 4 holding the substrates 5 is located above the target 10 in the magnetic film deposition chamber 1, the gate valve 7 is closed by means of the gate valve during apparatus 13.

Next, the sealed magnetic film deposition chamber 1 is provided with an atmosphere of argon gas. By operating a heater (not shown), the temperature of the substrate 5 is heated to, for instance, 300° C.

When the temperature of the substrates 5 located in the magnetic film deposition chamber 1 reaches a predetermined temperature, the magnetic field generating apparatus is operated and current flows to the Helmholtz coils 3 so that the magnetic field generated by the Helmholtz coils 3 is applied to the substrates 5.

The magnetic field is adjusted by the magnetic plates 6 as shown by the arrows H in FIG. 4 so that the magnetic field is parallel to the surfaces of the substrates 5 and has a uniform high magnetic flux density.

At the same time, high frequency electric power is supplied to the target 10 through the electric lead-in 9, and the bulk material such as permalloy is sputtered on to the surfaces of the substrates 5.

Since the uniform magnetic field is applied in parallel to the surfaces of the substrates 5, high quality magnetic films are deposited on the surfaces of the substrates 5.

In this kind of apparatus for producing magnetic films on the surfaces of the substrates 5, there is a tendency to increase the number of preliminary chambers and the number of substrates 5 held by the common substrate holder 4.

According to the embodiment of the present invention, since the magnetic plates 6 are fixed only within the magnetic film deposition chamber 1, the preliminary chamber 2 can be made smaller compared with the apparatus of the prior art so that the size of the apparatus relating to the present invention can be made small.

Namely, the space of the preliminary chamber 2 of the present invention can be made small. The number of substrates 5 held by the substrate holder 4 can be increased, when the sputtering apparatus for production of thin film of magnetic material of the present invention is manufactured in the same overall size as that of the prior art.

In the above embodiment of the present invention, we have described a magnetic film deposition chamber in which the magnetic films are deposited along a direction parallel to the surfaces of the substrates. However, the present invention is not limited to the embodiment. Namely, by changing the directions of the Helmholtz coils and the magnetic plates, it is possible to form magnetic films which are magnetized along the direction perpendicular to the surfaces of the substrates.

In the above embodiment, we described an apparatus in which only one preliminary chamber is provided.

However, the present invention is not limited to the embodiment. Namely, it is possible to provide a number of preliminary chambers in the present invention.

In the embodiment shown in FIGS. 5A and 5B, we described an apparatus in which the substrate holder is able to be moved vertically with respect to the conveying direction of the substrates by using adjusting means provided in the magnetic film deposition chamber. However, the present invention is not limited to the embodiment. Namely, the present invention can be applied to the apparatus in which the height of the conveyer is fixed and constant.

We claim:

1. Sputtering apparatus for production of thin films of magnetic materials, comprising a magnetic film deposition chamber which is provided with a target comprising a bulk magnetic material and a magnetic field generating apparatus, a preliminary chamber which is connected to said magnetic film deposition chamber through a gate valve which performs an opening and closing operation, said magnetic film deposition chamber further including two magnetic plates fixed apart from each other and positioned within and at opposite ends of said magnetic film deposition chamber to adjust the magnetic field generated by said magnetic field generating apparatus, substrate carrying means which moves from said preliminary chamber to said magnetic film deposition chamber through said gate valve, and an apertured substrate holder mounted on said carrying means, wherein a substrate is adapted to be conveyed above said target of said magnetic film deposition chamber from said preliminary chamber through said gate valve, a magnetic field generated by said magnetic field generating apparatus and said magnetic plates is applied to a surface of said substrate and bulk material sputtered from said target forms a magnetic film on the surface of the substrate through said aperture of said substrate holder.

2. A sputtering apparatus for production of thin films of magnetic materials according to claim 1, wherein said magnetic plates are made from the same material as said target.

3. A sputtering apparatus for production of thin films of magnetic materials according to claim 1, wherein said substrate carrying means has an adjusting means for adjusting the height of said substrate holder perpendicularly to the conveying direction of said substrate.

* * * * *